United States Patent
Maeda

(10) Patent No.: US 7,742,543 B2
(45) Date of Patent: Jun. 22, 2010

(54) TRANSMISSION CIRCUIT BY POLAR MODULATION SYSTEM AND COMMUNICATION APPARATUS USING THE SAME

(75) Inventor: Masakatsu Maeda, Kyoto (JP)

(73) Assignee: Panasonic Corporation, Osaka (JP)

( * ) Notice: Subject to any disclaimer, the term of this patent is extended or adjusted under 35 U.S.C. 154(b) by 841 days.

(21) Appl. No.: 11/648,649

(22) Filed: Jan. 3, 2007

(65) Prior Publication Data

US 2007/0165746 A1    Jul. 19, 2007

(30) Foreign Application Priority Data

Jan. 13, 2006    (JP) .............................. 2006-006360

(51) Int. Cl.
    *H03C 3/00* (2006.01)
(52) U.S. Cl. ....................... 375/302; 375/146; 375/296; 375/297; 375/300
(58) Field of Classification Search ................. 375/297, 375/308, 146, 300
    See application file for complete search history.

(56) References Cited

U.S. PATENT DOCUMENTS 7,023,294 B2 *   4/2006   Hauger et al. ............. 333/81 R 2003/0224743 A1   12/2003   Okada et al.
2004/0219891 A1*  11/2004   Hadjichristos .............. 455/102

FOREIGN PATENT DOCUMENTS

| EP | 1 667 330 | 6/2006 |
| JP | 2001-53631 | 2/2001 |
| JP | 2002-094357 | 3/2002 |
| WO | 2005/015757 | 2/2005 |

* cited by examiner

*Primary Examiner*—Shuwang Liu
*Assistant Examiner*—Dhaval Patel
(74) *Attorney, Agent, or Firm*—Wenderoth, Lind & Ponack L.L.P.

(57) ABSTRACT

A transmission circuit alleviates the frequency characteristics of a group delay and an attenuation amount in a transmission signal band and expands a dynamic range to a high frequency band. A ladder-type resistance-type attenuator includes switching elements, 2R resistor elements and R resistor elements. The 2R and R resistor elements are respectively connected to variable capacitor elements in parallel. The variable attenuator having such a connection structure is connected to an amplitude modulation loop of the transmission circuit. By controlling the capacitance value of the variable capacitor elements using the capacitance value control section when the switching elements are ON/OFF switched based on the transmission power control signal, the influence of parasitic capacitances of the variable capacitor elements is suppressed and the group delay between the amplitude modulation and the phase modulation is reduced.

6 Claims, 13 Drawing Sheets

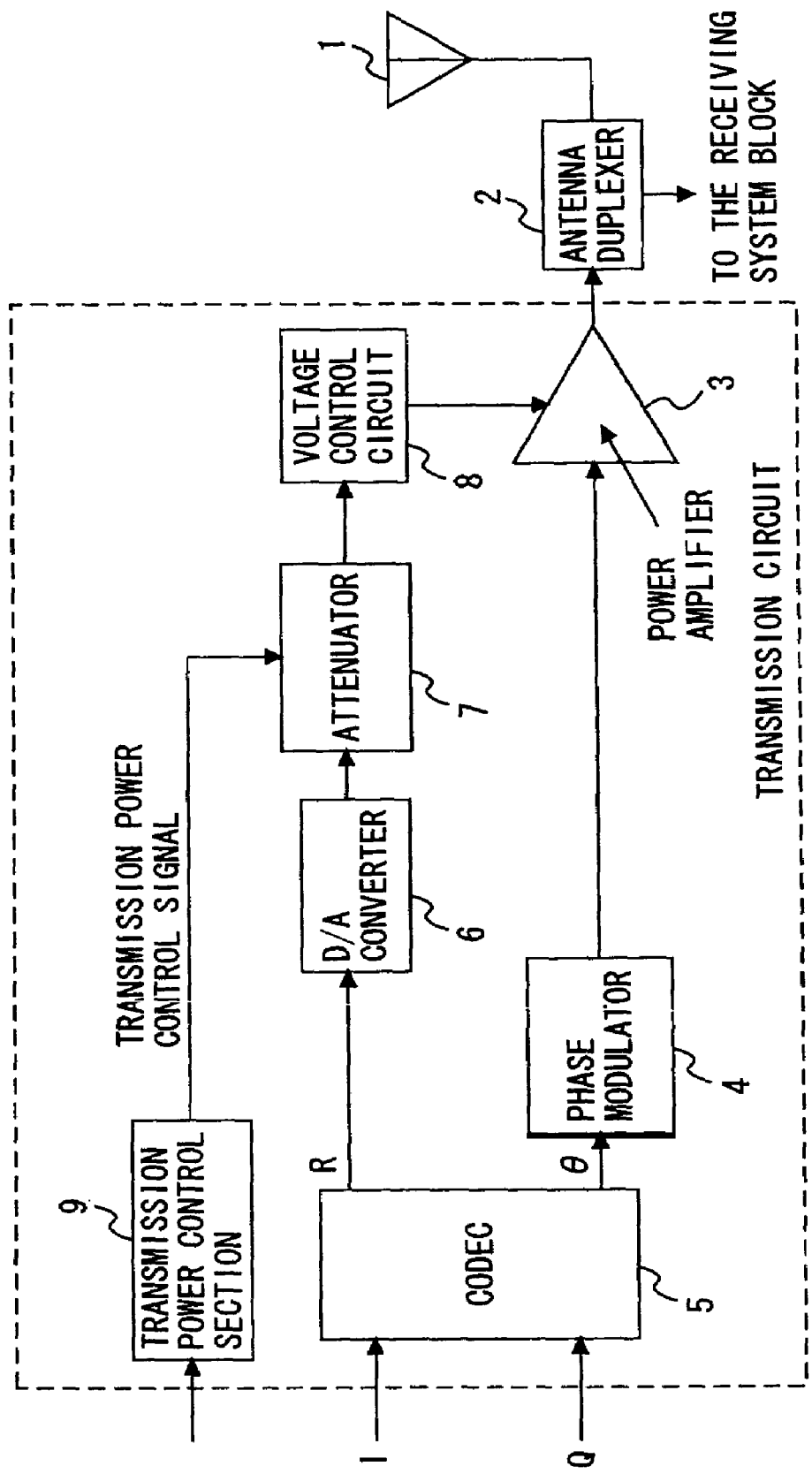
F I G. 1

F I G. 1 2    PRIOR ART
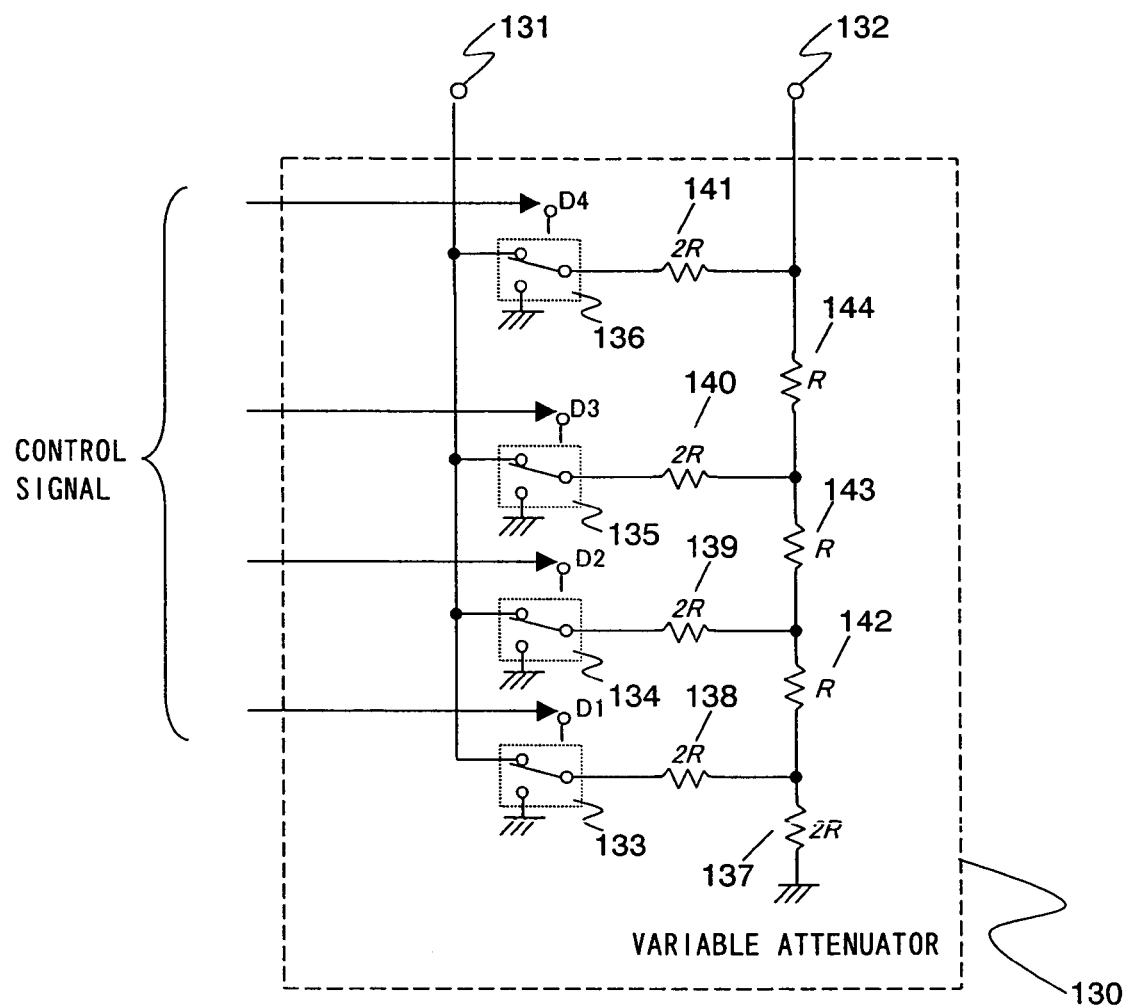

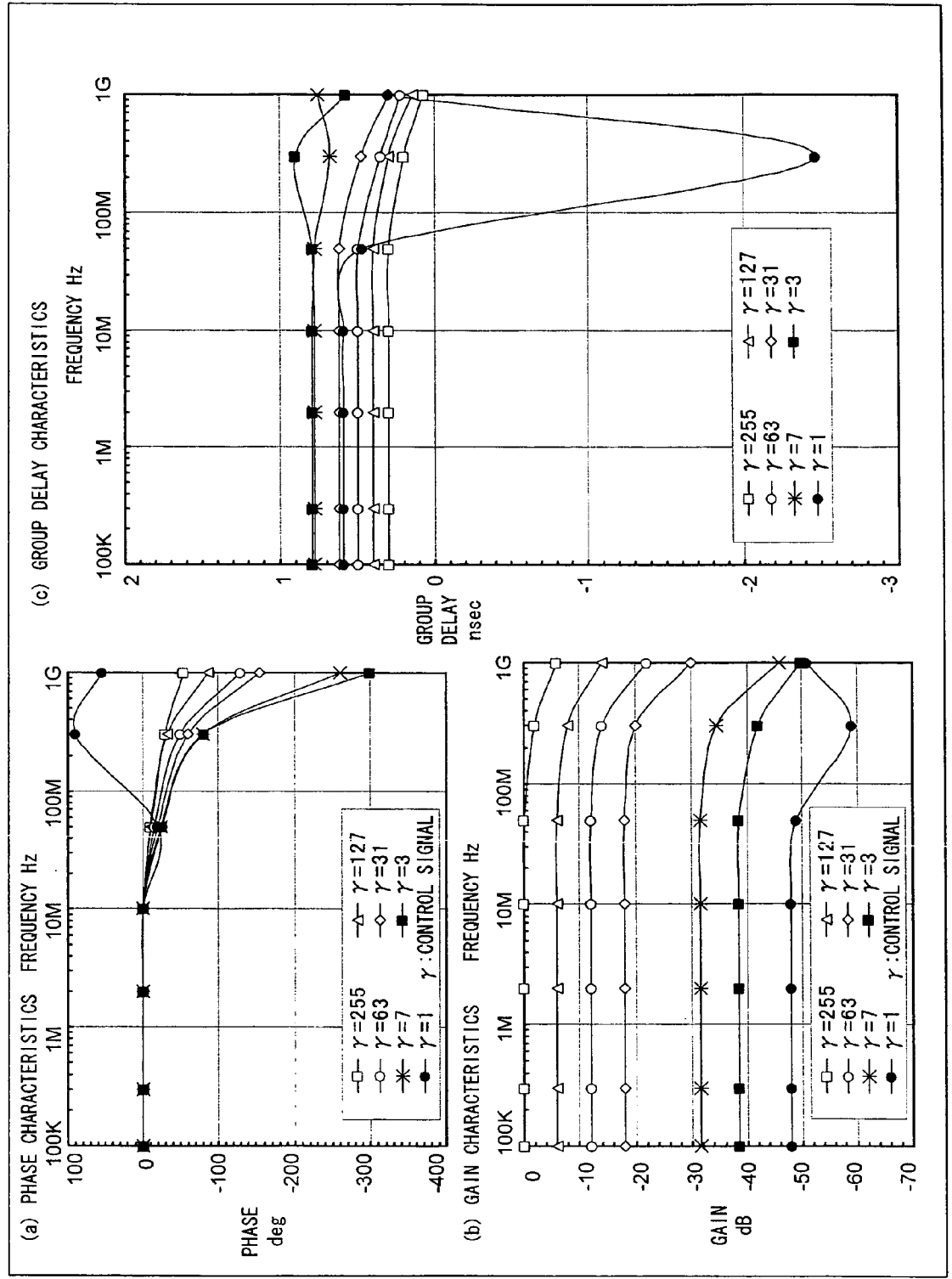

TRANSMISSION CIRCUIT BY POLAR MODULATION SYSTEM AND COMMUNICATION APPARATUS USING THE SAME

BACKGROUND OF THE INVENTION

1. Field of the Invention

The present invention relates to a transmission circuit usable for a communication apparatus, such as a mobile phone, a wireless LAN device or the like, and more specifically to a transmission circuit for alleviating the frequency characteristics of a group delay and an attenuation amount in a transmission signal band and also for expanding the dynamic range to a high frequency band, and a communication apparatus using the same.

2. Description of the Background Art

As a conventional transmission circuit for a mobile phone, a transmission circuit of a quadrature modulation system as shown in FIG. 9 is used. FIG. 9 is a block diagram showing an exemplary structure of a conventional transmission circuit of the quadrature modulation system. As shown in FIG. 9, the conventional transmission circuit of the quadrature modulation system includes D/A converters 101 and 104, low pass filters 102 and 105, mixers 103 and 106, a local oscillator 107, a phase shifter 108, an adder 109, an RF filter 110, an attenuator 111, a power amplifier 112, and an isolator 113.

I and Q signals which are input from a baseband circuit (not shown) are respectively input to the mixers 103 and 106 via the D/A converters 101 and 104 and the low pass filters 102 and 105. The signals which are input to the mixers 103 and 106 are mixed together by a signal divided by a phase frequency division circuit including the local oscillator 107 and the phase shifter 108 and then processed with quadrature modulation by the adder 109. An output signal from the adder 109 passes through the RF filter 110 for suppressing an unnecessary harmonic, is amplified by the power amplifier 112 via the attenuator 111, and then is output to an antenna duplexer (not shown) via the isolator 113 for suppressing the load fluctuation of the power amplifier 112.

Various communication systems are widely used in the world today, and a multi-mode wireless communication system compatible with a plurality of communication systems is desired. However, a multi-mode wireless communication terminal based on the conventional technology has an increased size due to a large number of components especially in a wireless section, and thus has a high cost. Therefore, being able to use one component for different purposes is an important issue in realizing a multi-mode wireless communication terminal.

In the EDGE (Enhanced Data GSMEnvironment) system, which was developed for the purpose of raising the communication speed based on GSM (Global System for Mobile Communications) and is one standard of the mobile phone, a polar modulation system is often used as a modulation system in a wireless transmission section for the following reasons. The polar modulation system has a high level of affinity with a transmission circuit structure of GMSK (Gaussian filtered Minimum Shift Keying) modulation, which is a conventional modulation system. By adopting a polar modulation system in a multi-mode wireless communication terminal compatible with the GSM system and UMTS (Universal Mobile Telecommunications System), the system is simplified because a single platform can be used.

With such a background, a transmission circuit of the polar modulation system has been proposed. FIG. 10 is a block diagram showing an exemplary structure of a conventional transmission circuit of a polar modulation system. As shown in FIG. 10, I and Q signals which are input from a baseband circuit (not shown) are separated into an amplitude signal and a phase signal by a CODEC 114. The amplitude signal is amplitude-modulated by an amplitude modulator 115 and is input to a voltage control circuit 118 via a D/A converter 116 and an attenuator 117. The voltage control circuit 118 outputs a signal which is preset in accordance with the magnitude of the amplitude signal to a power amplifier 119. The phase signal is input to a phase modulator 120. The phase modulator 120 performs phase modulation on the input phase signal and outputs the resultant signal as a phase modulated signal. The power amplifier 119 performs amplitude modulation on the phase modulated signal which is output from the phase modulator 120 with a signal which is output from the voltage control circuit 118, and outputs the resultant signal to an antenna duplexer (not shown) as an amplitude modulated signal.

As compared with the transmission circuit by the quadrature modulation system described above with reference to FIG. 9, the transmission circuit of the polar modulation system does not need an analog quadrature modulator and thus does not need the RF filter 110. In addition, the transmission circuit of the polar modulation system can reduce power consumption because the power amplifier 119 does not need to provide linearity. The transmission circuit using the polar modulation system does not need an isolator 113 either because the influence of the load fluctuation is alleviated.

Despite the above-described advantages, the transmission circuit of the polar modulation system has the problem that because the amplitude signal and the phase signal are separate, the transmission circuit cannot provide functions thereof sufficiently if the amplitude signal and the phase signal are different in group delay, even though the amplitude signal and the phase signal are synthesized by the power amplifier 119.

One exemplary circuit for reducing the group delay included in a high frequency signal is, for example, a group delay compensation circuit disclosed in Japanese Laid-Open Patent Publication No. 2001-53631 (hereinafter, referred to as "patent document 1"). FIG. 11 is a block diagram showing an exemplary structure of a conventional group delay compensation circuit 122 disclosed in patent document 1. As shown in FIG. 11, the conventional group delay compensation circuit 122 includes a fixed delay device 123, a variable phase device 124, a variable attenuator 125, a frequency displacement detector 126, and a signal converter 127. The fixed delay device 123 outputs a high frequency signal which passed through an analog filer 121 with a delay of a certain length of time. The frequency displacement detector 126 detects a displacement amount, from the central frequency, of the high frequency signal which passed through the analog signal 121. The signal converter 127 generates a control signal for controlling the delay amount of the variable phase device 124 and a control signal for controlling the amplitude level of the variable attenuator 125, based on the displacement amount detected by the frequency displacement detector 126. The variable phase device 124 controls the phase of the output signal from the fixed delay device 123 by the control signal. The variable attenuator 125 controls the amplitude of the output signal from the variable phase device 124 by the control signal.

As described above, in the conventional group delay compensation circuit 122, the signal converter 127 controls the phase amount of the variable phase device 124 such that the delay time in the transfer signal band is flattened based on the displacement amount detected by the frequency displacement detector 126. Namely, the conventional group delay compensation circuit 122 matches the delay time at and around the cut-off frequency on the low frequency side, the delay time at and around the central frequency, and the delay time at and around the cut-off frequency on the high frequency side, by controlling the phase amount of the variable phase device 124. As a result, the high frequency signal which passed through the analog filter 121 is output as a signal having the group delay deviation flattened by the group delay compensation circuit 122 although the overall delay amount is increased.

As an exemplary structure of a conventional variable attenuator 125, a structure of a 4-bit variable attenuator 130 using resistor elements will be shown. FIG. 12 shows an exemplary structure of the conventional 4-bit variable attenuator 130. As shown in FIG. 12, the 4-bit variable attenuator 130 includes an input terminal 131, an output terminal 132, switching elements 133 through 136, 2R resistor elements 137 through 141, and R resistor elements 142 through 144.

The 2R resistor elements 137 through 141 each have a resistance value twice as high as that of each of the R resistor elements 142 through 144. Therefore, a 2R resistor element may have a structure of two R resistor elements connected in series. Control terminals D1 through D4 of the switching elements 133 through 136 are connected to a transistor-transistor logic (TTL) circuit (not shown) and perform ON/OFF switching operations in accordance with a control signal (binary data) which is output from the TTL circuit.

Specifically, the 4-bit variable attenuator 130 of a ladder type as shown in FIG. 12 has the following connection structure. In the 4-bit variable attenuator 130, the switching element 133 and the 2R resistor element 138 are connected in series, the switching element 134 and the 2R resistor element 139 are connected in series, the switching element 135 and the 2R resistor element 140 are connected in series, and the switching element 136 and the 2R resistor element 141 are connected in series. The switching elements 133 through 136 are each connected to the input terminal 131. One output of the 2R resistor element 138 is grounded via the 2R resistor element 137, and other output of the 2R resistor element 138 is connected to the 2R resistor element 139 via the R resistor element 142. The 2R resistor element 139 is connected to the 2R resistor element 140 via the R resistor element 143. The 2R resistor element 140 is connected to the 2R resistor element 141 via the R resistor element 144. The connection point between the 2R resistor element 141 and the R resistor element 144 is connected to the output terminal 132.

The attenuation amount which is set for the 4-bit variable attenuator 130 having the ladder structure shown in FIG. 12 is represented by expression (1).

$$\text{Attenuation amount dB} = 20 \log(\text{control signal}/2^4) \quad \text{expression (1)}$$

where $0 \leq \text{control signal} \leq 2^4 - 1$

When the control signal is 3, the binary thereof is "0011", and the value of "0" or "1" at each level represents the state of D4, D3, D2 or D1. Namely, at "0", the switching element is controlled to be grounded; and at "1", the switching element is controlled to be connected to the input terminal 131 of the 4-bit variable attenuator 130. By switching the four switching elements 133 through 136 to ON or OFF in this manner, the 4-bit variable attenuator 130 can output a signal shaped by an attenuation amount of one of 16 stages of "0000" through "1111" from the output terminal 132.

However, the conventional 4-bit variable attenuator 103 shown in FIG. 12 has the following problem. When the switching elements 133 through 136 are each formed of, for example, a MOS transistor, unless the ON resistance value of the MOS transistor is sufficiently smaller than the resistance value of the 2R resistor elements 137 through 141 and the R resistor elements 142 through 144, the output signal is distorted.

The 2R resistor elements 137 through 141 and the R resistor elements 142 through 144 do not have a frequency characteristic. However, when the switching elements 133 through 136 are each formed of, for example, a MOS transistor, the switching elements 133 through 136 are influenced by the parasitic capacitance of the MOS transistor and the frequency characteristics thereof are deteriorated.

With reference to FIG. 13, the influence of the parasitic capacitance of a switching element in a conventional variable attenuator will be described. FIG. 13 shows operation simulation results of a conventional 8-bit variable attenuator. Although not shown, the 8-bit variable attenuator may include 10 switching elements, 11 2R resistor elements, and 9 R resistor elements based on the structure of the 4-bit variable attenuator 130 shown in FIG. 12. Namely, the attenuation amount of the 8-bit variable attenuator can be controlled to be any one of 256 stages by a transmission power control signal.

In FIG. 13, (a) shows the phase characteristics, (b) shows the gain characteristics, and (c) shows the group delay characteristics. It is understood that by the influence of the parasitic capacitance of the switching elements, the group delay deviation is −2.4 nsec. at the maximum when the transmission power control signal=1, is 1.4 nsec. at the maximum when the transmission power control signal=3, and is 0.3 nsec. at the maximum when the transmission power control signal=255.

As the transmission power control signal is increased, i.e., as the number of the resistor elements is increased, the influence of the parasitic capacitance of the switching elements becomes conspicuous. As the transmission power control signal is increased, i.e., as the number of the resistor elements is increased, it becomes difficult for the gain characteristics to be kept flat to the high frequency area.

SUMMARY OF THE INVENTION

Therefore, an object of the present invention, for solving these problems of the conventional art, is to provide a transmission circuit for alleviating the frequency characteristics of the group delay and the attenuation amount in a transmission signal band and expanding the dynamic range to a high frequency band, and a communication apparatus using the same.

The present invention is directed to a transmission circuit using a polar modulation system. In order to attain the above object, the transmission circuit according to the present invention comprises a transmission power control section for generating a transmission power control signal for controlling transmission power of the transmission circuit; an attenuator for attenuating a magnitude of an amplitude signal by an attenuation amount in accordance with the transmission power control signal; a voltage control circuit for outputting a voltage controlled signal which is controlled in accordance with the amplitude signal input via the attenuator; a phase modulator for performing phase modulation on a phase signal and outputting the resultant signal as a phase modulated signal; and a power amplifier for amplifying the phase modulated signal in accordance with the voltage controlled signal which is output from the voltage control circuit to perform amplitude modulation on the phase modulated signal, and outputting the resultant signal as a transmission signal. The attenuator includes a plurality of resistor elements, a plurality of switching elements for switching the connection between the plurality of resistor elements and an input terminal in accordance with a value of the transmission power control signal, a variable capacitor element connected to each of the plurality of resistor elements in parallel, and a capacitance value control section for controlling capacitance values of the variable capacitor elements based on the transmission power control signal.

Preferably, when the amplitude signal is larger than a limit value in accordance with the transmission power control signal, the attenuator shapes a waveform of the amplitude signal such that the amplitude signal is equal to or smaller than the limit value.

The attenuator switches the plurality of switching elements to ON or OFF in accordance with a value of the transmission power control signal so as to control an attenuation amount by which the amplitude signal is attenuated in a stepped manner.

The attenuator may further include a characteristic frequency adjusting section for adjusting a characteristic frequency of the capacitance value control section. In this case, the characteristic frequency adjusting section includes a reference frequency signal generator for generating a reference frequency signal; a band pass filter for allowing the reference frequency signal to pass therethrough; and a phase comparator for comparing a phase of the reference frequency signal which has passed the band pass filter and a phase of the reference frequency signal generated by the reference frequency signal generator. Characteristic frequencies of the band pass filter and the capacitance value control section are adjusted in accordance with the result of the comparison performed by the phase comparator.

Preferably, the band pass filter includes a resistor element and a variable capacitor element having a characteristic equivalent to that of the resistor elements and the variable capacitor elements included in the attenuator.

The present invention is also directed to a communication apparatus comprising the above-described transmission circuit. The communication apparatus comprises a transmission circuit for generating a transmission signal; and an antenna for outputting the transmission signal generated by the transmission circuit. The communication apparatus may further comprise a receiving circuit for processing a receiving signal received from the antenna; and an antenna duplexer for outputting a transmission signal generated by the transmission circuit to the antenna and outputting a receiving signal received from the antenna to the receiving circuit.

The transmission circuit according to the present invention, by changing the capacitance values of the variable capacitance elements included in the attenuator in accordance with the transmission power control signal, can improve the gain characteristics and the group delay characteristics. Thus, the transmission circuit according to the present invention can alleviate the frequency characteristics of the group delay and the attenuation amount in a transmission signal area and expand the dynamic range to a high frequency band.

The communication apparatus according to the present invention, by using the above-described transmission circuit, can acquire the precision of the output signal over a wide dynamic range while operating at a low power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing an exemplary structure of a transmission circuit of a polar modulation system according to a first embodiment of the present invention;

FIG. 12 is a block diagram showing an exemplary structure of a conventional 4-bit variable attenuator 130; and FIG. 13 shows operation simulation results of a conventional 8-bit variable attenuator.

DESCRIPTION OF THE PREFERRED EMBODIMENTS

Figure 2:
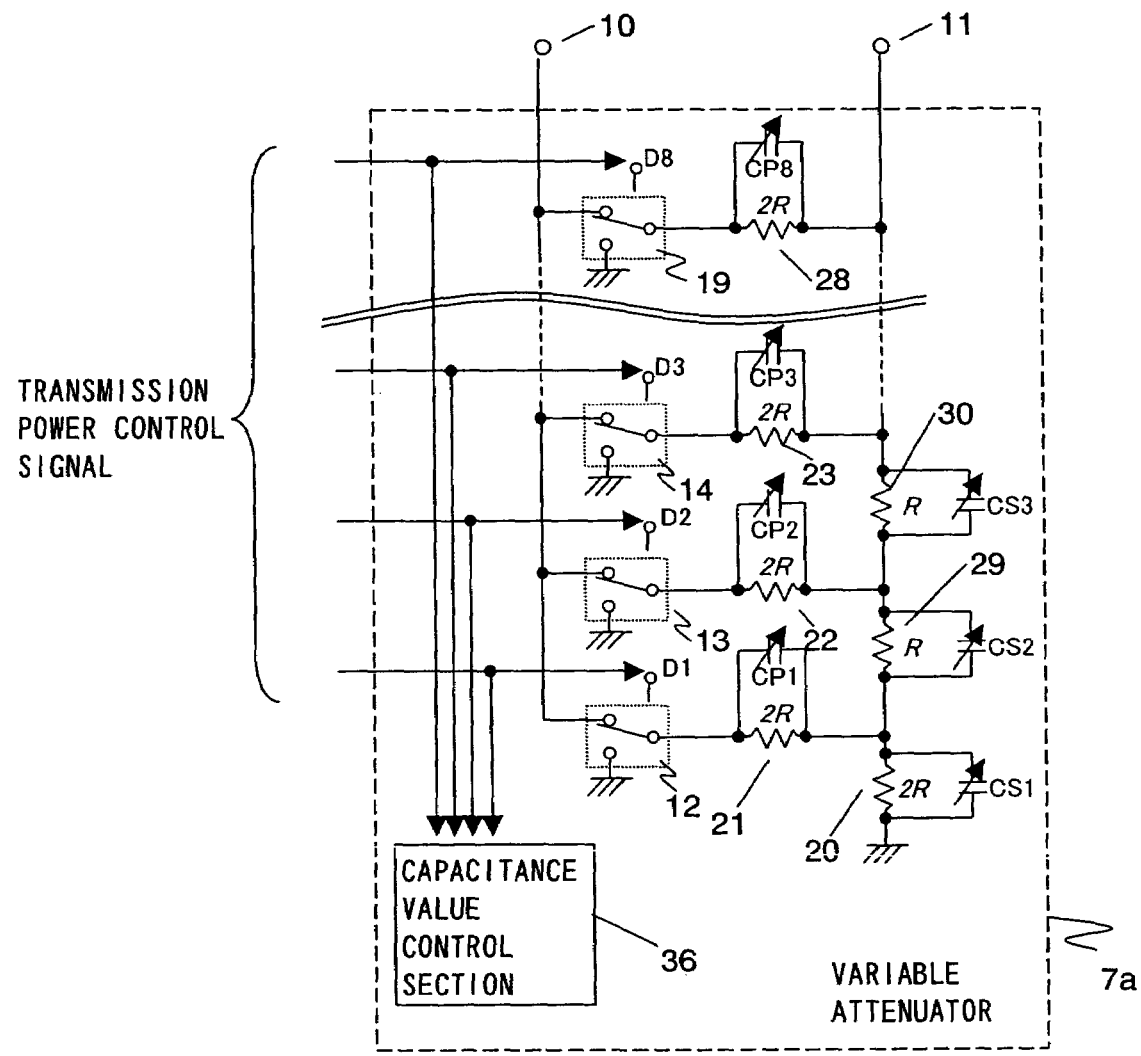
FIG. 2 shows an exemplary structure of a variable attenuator 7a according to the first embodiment of the present invention.

Hereinafter, the present invention will be described by way of embodiments with reference to the drawings.

First Embodiment

FIG. 1 is a block diagram showing an exemplary structure of a transmission circuit of a polar modulation system according to a first embodiment of the present invention. As shown FIG. 1, the transmission circuit includes a power amplifier 3, a phase modulator 4, a CODEC 5, a D/A converter 6, an attenuator 7, a voltage control circuit 8, and a transmission power control section 9. To the CODEC 5, a digital baseband signal is input from a baseband circuit (not shown). The digital baseband signal has been converted into polar coordinate data based on IQ constellation. The CODEC 5 converts the input IQ vector into an RO vector using a CODEC algorithm. "R" represents the magnitude of the IQ vector, i.e., the amplitude signal, and "0" represents the angle of the IQ vector, i.e., the phase signal. The phase signal 0 is input to the phase modulator 4. The phase modulator 4 performs phase modulation (frequency modulation) on the input phase signal 0 using a PLL (not shown) and outputs the resultant signal as a phase modulated signal having a desired frequency characteristic.

The amplitude signal is input to the attenuator 7 via the D/A converter 6. The transmission power control section 9 generates a transmission power control signal for controlling the transmission power of the transmission circuit based on information from a base station. The transmission power control signal is input to the attenuator 7. The attenuator 7 attenuates the amplitude signal input via the D/A converter 6 by an attenuation amount in accordance with the transmission power control signal. As the attenuator 7, a resistance-type attenuator of an R-2R type, t type, T type or the like is usable. The output signal from the attenuator 7 is input to the voltage control circuit 8.

The voltage control circuit 8 controls a signal in accordance with the amplitude signal which is input via the attenuator 7, and outputs the resultant signal as a voltage controlled signal to the power amplifier 3. The voltage control circuit 8 is required to have a low output impedance in order to drive the power amplifier 3. The voltage control circuit 8 includes, for example, a switching regulator or a series regulator. The power amplifier 3 amplifies the phase modulated signal which is output from the phase modulator 4 in accordance with the voltage controlled signal which is output from the voltage control circuit 8 to perform amplitude modulation on the phase modulated signal, and outputs the resultant signal as a transmission signal. The transmission signal is output to the outside from an antenna 1 via an antenna duplexer 2. The antenna duplexer 2 outputs a signal from the transmission circuit and a signal from a receiving system block (not shown) to the antenna 1 while isolating the signals.

As described above, the attenuator 7 attenuates an amplitude signal which is input via the D/A converter 6 by an attenuation amount in accordance with the transmission power control signal. Namely, when the amplitude signal is larger than a limit value in accordance with the transmission power control signal, the attenuator 7 shapes the waveform of the amplitude signal such that the amplitude signal is equal to or smaller than the limit value. As the attenuator 7 according to the first embodiment, a variable attenuator 7a as shown in FIG. 2 is usable, for example. FIG. 2 shows an exemplary structure of the variable attenuator 7a according to the first embodiment of the present invention. In this example, the variable attenuator 7a is an 8-bit variable attenuator.

As shown in FIG. 2, the variable attenuator 7a includes an input terminal 10, an output terminal 11, 8 switching elements 12 through 19, 9 2R resistor elements 20 through 28, 7 R resistor elements 29 through 35, 8 variable capacitor elements CP1 through CP8, 8 variable capacitor elements CS1 through CS8, and a capacitance value control section 36. The 2R resistor elements 20 through 28 each have a resistance value twice as high as that of each of the R resistor elements 29 through 35. The switching elements 12 through 19 respectively have control terminals D1 through D8. The control terminals D1 through D8 are connected to the transmission power control section 9, and perform ON/OFF switching operations of the switching elements 12 through 19 in accordance with a transmission power control signal which is output from the transmission power control section 9.

Specifically, the variable attenuator 7a of a ladder type as shown in FIG. 2 has the following connection structure. In the variable attenuator 7a, the switching element 12 and the 2R resistor element 21 are connected in series, the switching element 13 and the 2R resistor element 22 are connected in series, the switching element 14 and the 2R resistor element 23 are connected in series, . . . , and the switching element 19 and the 2R resistor element 28 are connected in series. The switching elements 12 through 19 are connected to the input terminal 10. One output of the 2R resistor element 21 is grounded via the 2R resistor element 20. The other output of the 2R resistor element 21 is connected to the 2R resistor element 22 via the R resistor element 29. The 2R resistor element 22 is connected to the 2R resistor element 23 via the R resistor element 30, . . . , and the 2R resistor element 27 is connected to the 2R resistor element 28 via the R resistor element 35. The connection point between the 2R resistor element 28 and the R resistor element 35 is connected to the output terminal 11.

The 8 2R resistor elements 21 through 28 are respectively connected to the variable capacitor elements CP1 through CP8 in parallel. One 2R resistor element 20 is connected to the variable capacitor element CS1 in parallel. The 7 R resistor elements 29 through 35 are connected to the variable capacitor elements CS2 through CS8 in parallel. The variable capacitor elements CP1 through CP8 and CS1 through CS8 are connected to the capacitance value control section 36. The capacitance value control section 36 changes the capacitance values of the variable capacitor elements CP1 through CP8 and CS1 through CS8 discretely or continuously.

The 8 switching elements 12 through 19 respectively include the control terminals D1 through D8. The variable attenuator 7a operates as follows. When a transmission power control signal is input to the PLL circuit (not shown), the binary data of "0" or "1" is transmitted from the PLL circuit to the control terminals D1 through D8 in accordance with the transmission power control signal. The 8 switching elements 8 through 15 perform the ON/OFF switching operations based on the binary data. The 9 2R resistor elements 20 through 28 each have a resistance value twice as high as that of each of the 7 R resistor elements 29 through 35.

The variable attenuator 7a in this embodiment is different from the conventional variable attenuator 130 using switching elements and resistor elements shown in FIG. 12 in that variable capacitor elements CP1 through CP8 and CS1 through CS8 are respectively connected to the resistor elements in parallel.

The attenuation amount which is set for the variable attenuator 7a having the ladder structure shown in FIG. 2 is represented by expression (2).

Attenuation amount dB=20 log(transmission power control signal/$2^8$)                         expression (2)

where $0 \leq$ control signal $\leq 2^8 - 1$

Figure 3:
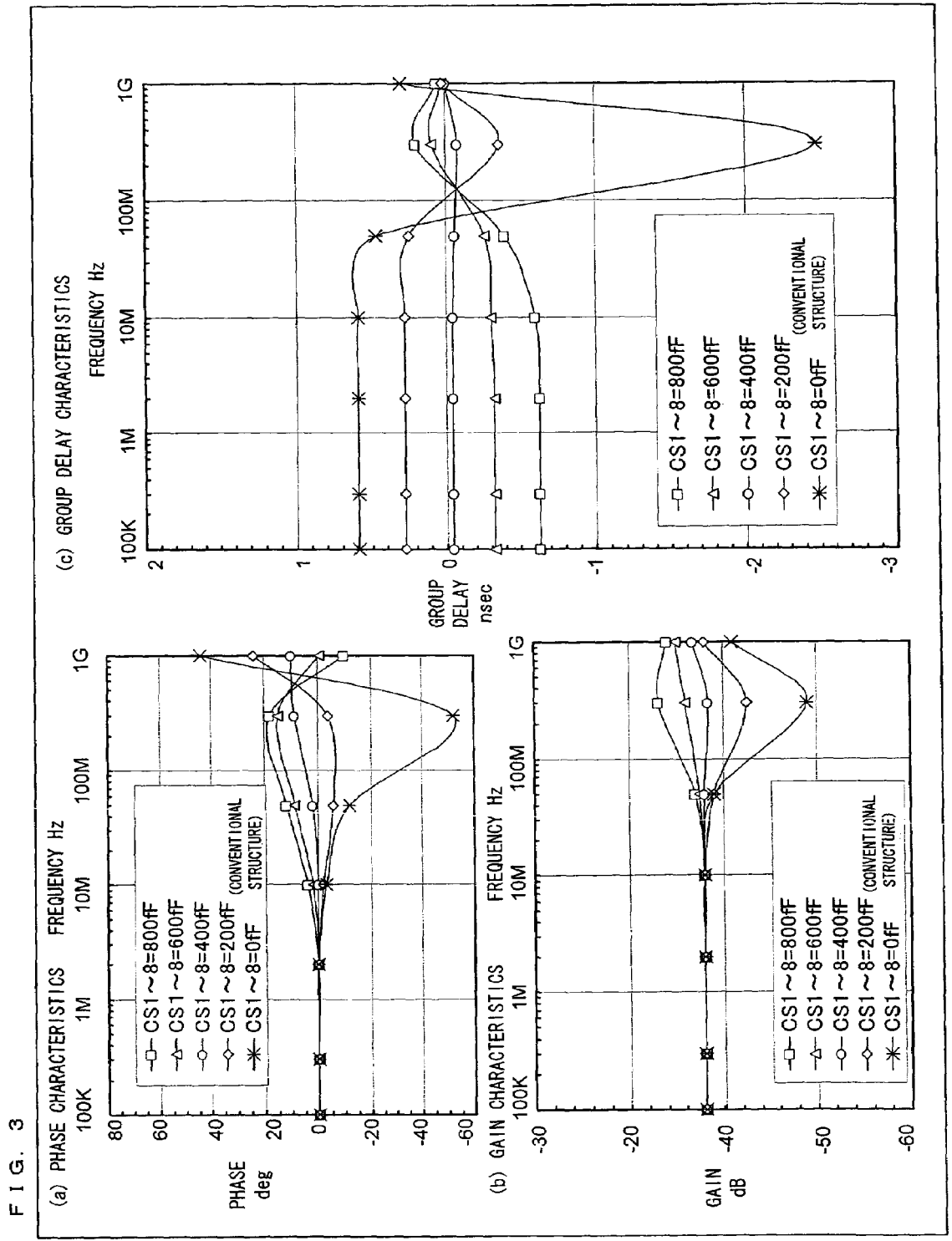
FIG. 3 shows operation simulation results of the variable attenuator 7a according to the first embodiment of the present invention (when the transmission power control signal=1)
Figure 4:
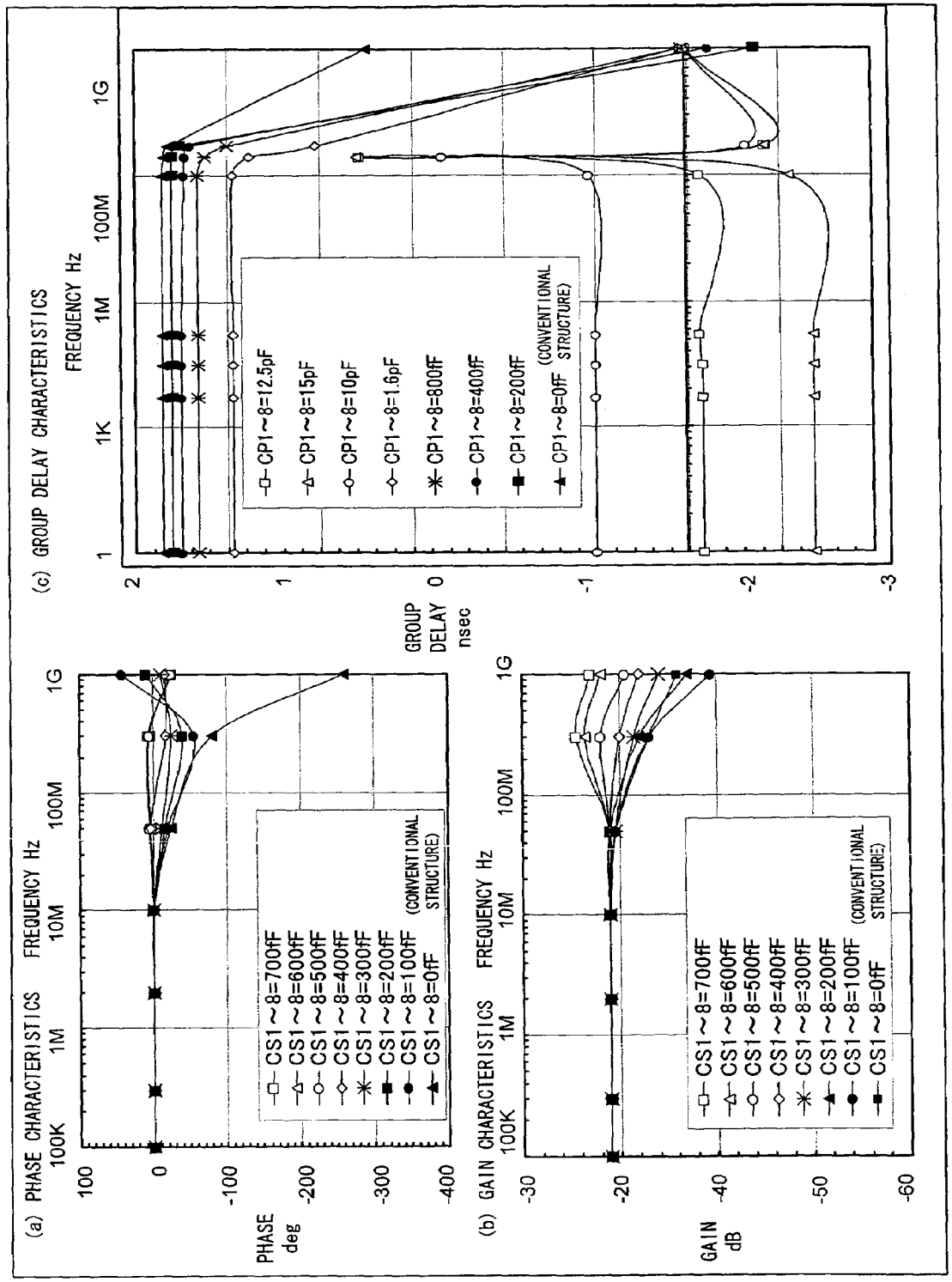
FIG. 4 shows operation simulation results of the variable attenuator 7a according to the first embodiment of the present invention (when the transmission power control signal=3)
Figure 5:
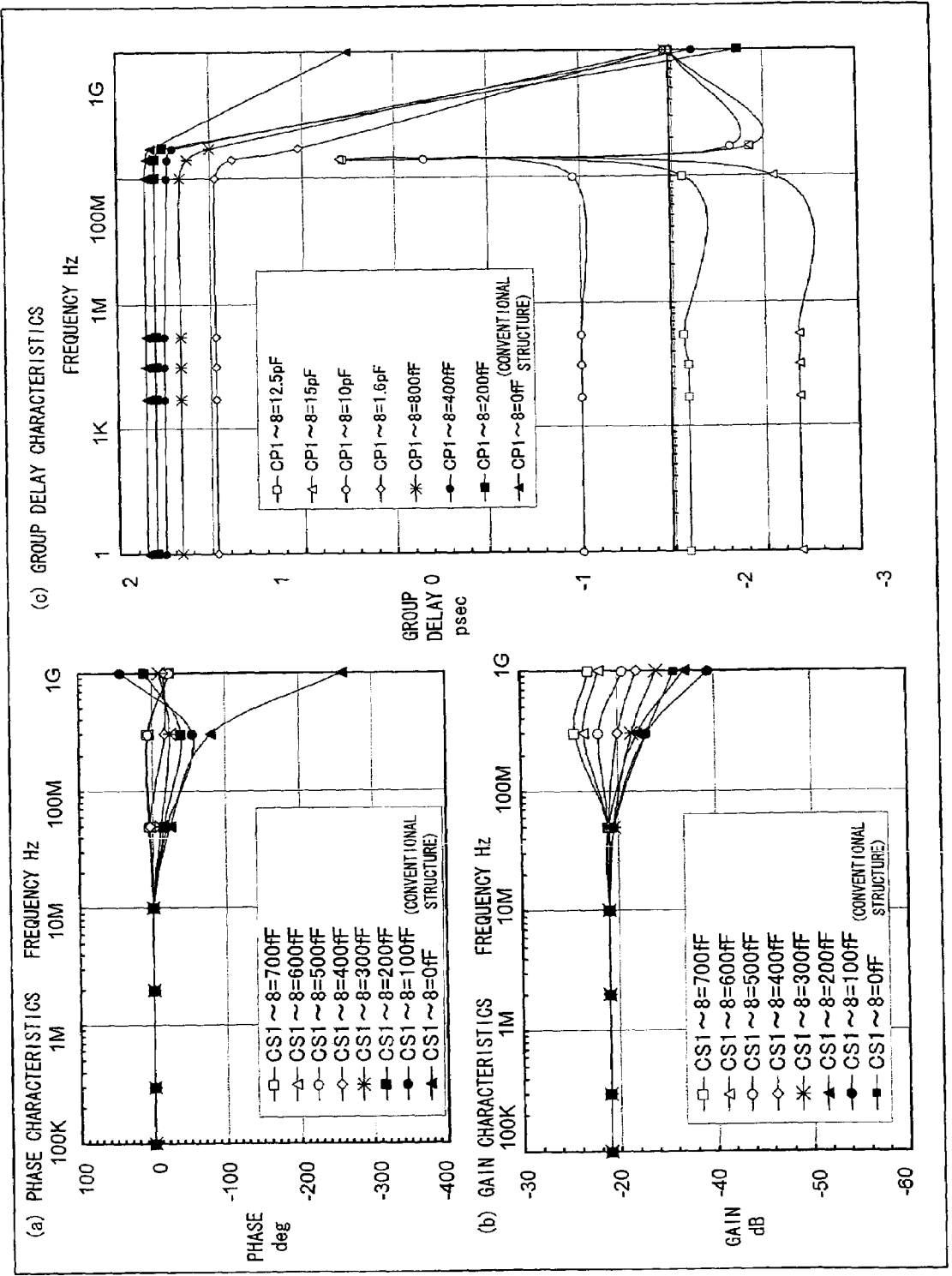
FIG. 5 shows operation simulation results of the variable attenuator 7a according to the first embodiment of the present invention (when the transmission power control signal=255)

FIG. 3 through FIG. 5 show operation simulation results of the variable attenuator 7a according to the first embodiment of the present invention. FIG. 3 shows the operation simulation results when the transmission power control signal=1. FIG. 4 shows the operation simulation results when the transmission power control signal=3. FIG. 5 shows the operation simulation results when the transmission power control signal=255. In FIG. 3 through FIG. 5, (a) shows the phase characteristics, (b) shows the gain characteristics, and (c) shows the group delay characteristics.

When the variable capacitor elements CS1 through CS8 are set to 400 fF in FIG. 3, when the variable capacitor elements CS1 through CS8 are set to 500 fF in FIG. 4, and when the variable capacitor elements CP1 through CP8 are set to 12.5 pF in FIG. 5, the group delay deviation is suppressed to ±100 psec. or less as opposed to about −2.4 nsec./1.4 nsec./0.3 nsec. at the maximum obtained with the conventional variable attenuator shown in FIG. 13. The absolute value of the group delay is about 0 nsec. The gain characteristic is flat to a high frequency area which is higher than that by the conventional art. The usable frequency band is expanded to the high frequency area.

As described above, with the transmission circuit according to the first embodiment of the present invention, by varying the capacitance values of the variable capacitor elements CS1 through CS8 and CP1 through CP8 included in the attenuator 7a in accordance with the transmission power control signal, the gain characteristics and the group delay characteristics can be improved. Thus, the transmission circuit alleviates the frequency characteristics of the group delay and the attenuation amount in a transmission signal band and also expands the dynamic range to a high frequency band.

In this embodiment, the variable attenuator 7a is an 8-bit variable attenuator. The number of bits of the variable attenuator 7a may be changed in accordance with the use of the transmission circuit. In this embodiment, R2R type resistance-type attenuators are used. Alternatively, for example, π type or T type resistance-type attenuators provide substantially the same effect by connecting the variable capacitor elements to the resistor elements in parallel and controlling the capacitance values thereof in accordance with the transmission power control signal. In this embodiment, the variable capacitor elements CS1 through CS8 and CP1 through CP8 are connected to the resistor elements in parallel. Alternatively, a part of the variable capacitor elements may be replaced with capacitor elements having a fixed capacitance value.

Second Embodiment

Figure 6:
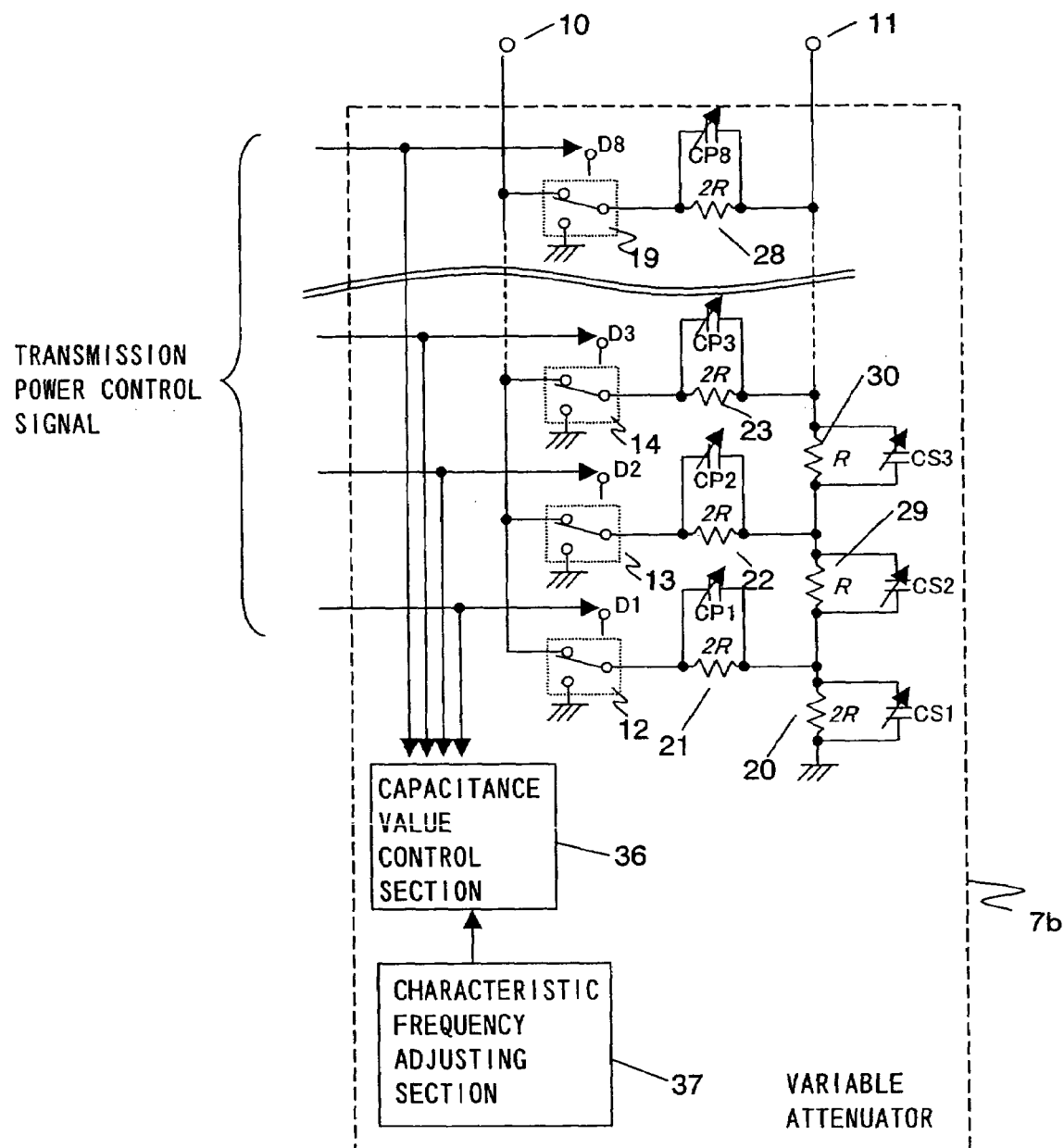
FIG. 6 shows an exemplary structure of a variable attenuator 7b according to a second embodiment of the present invention.

A transmission circuit according to a second embodiment of the present invention is different from that according to the first embodiment in the structure of the attenuator 7. As the attenuator 7 in the second embodiment, a variable attenuator 7b as shown in FIG. 6, for example, is usable. FIG. 6 shows an exemplary structure of the variable attenuator 7b according to the second embodiment of the present invention. In this example, the variable attenuator 7b is an 8-bit variable attenuator. As shown in FIG. 6, the variable attenuator 7b in the second embodiment of the present invention is different from the variable attenuator 7a in the first embodiment in that the former includes a characteristic frequency adjusting section 37. In this embodiment, identical elements to those of the first embodiment bear identical reference numerals thereto and descriptions thereof will be omitted.

The variable attenuator 7a in the first embodiment improves the gain characteristics and the group delay characteristics by changing the capacitance values of the variable capacitor elements CS1 through CS8 and CP1 through CP8 in accordance with the control of the capacitance value control section 36. Such a variable attenuator 7a, when being actually mounted on a semiconductor integrated circuit, does not provide a sufficient effect of characteristic improvement due to significant variances in resistor elements, capacitor elements and parasitic capacitances of the switching elements.

Figure 7:
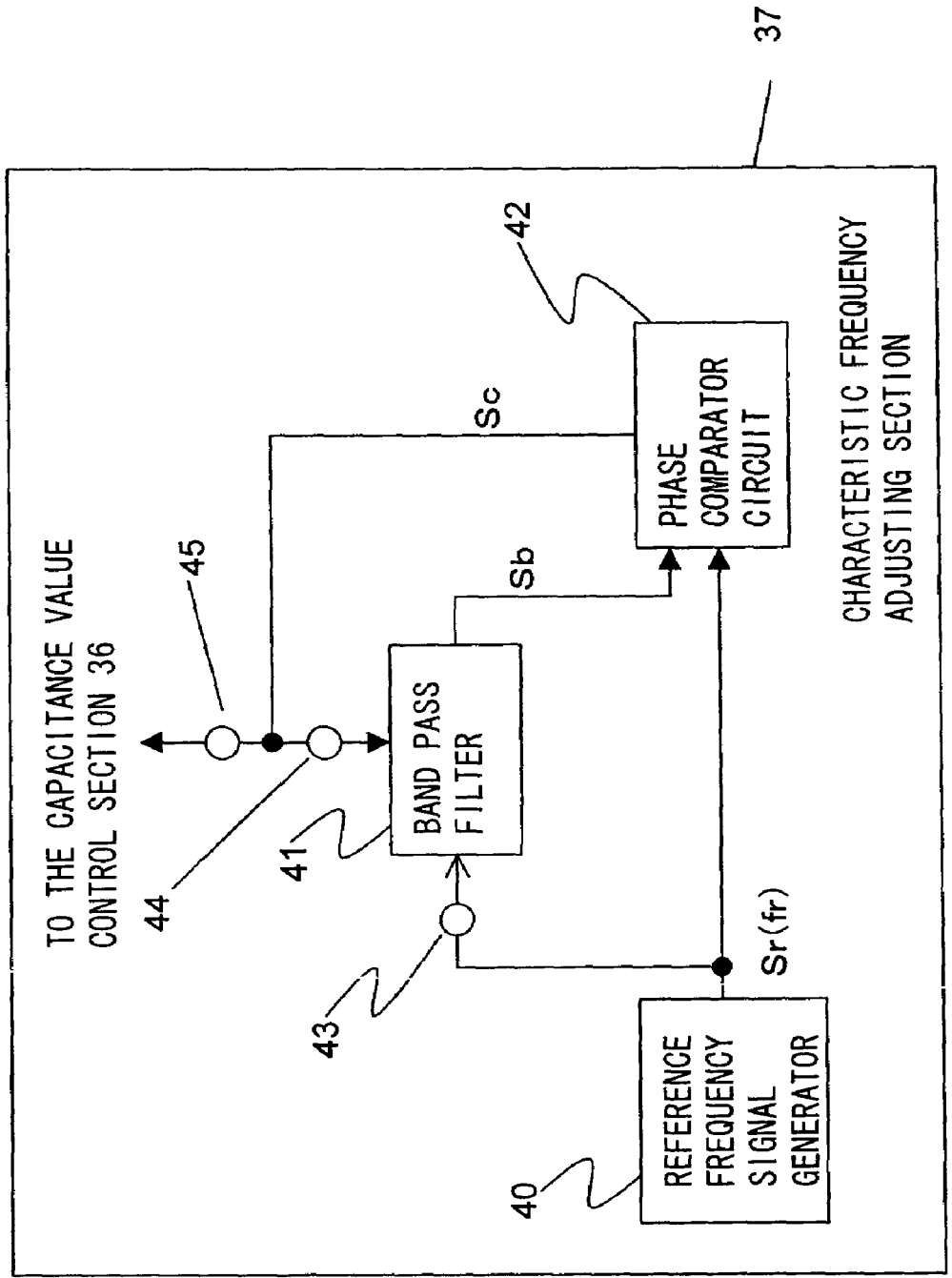
FIG. 7 is a block diagram showing an exemplary structure of a characteristic frequency adjusting section 37 according to the second embodiment of the present invention.

The variable attenuator 7b according to the second embodiment of the present invention includes the characteristic frequency adjusting section 37 having a structure shown in FIG. 7. FIG. 7 is a block diagram showing an exemplary structure of the characteristic frequency adjusting section 37 according to the second embodiment of the present invention. As shown in FIG. 7, the characteristic frequency adjusting section 37 includes a reference frequency signal generator 40, a band pass filter 41, and a phase comparator circuit 42. The reference frequency signal generator 40 generates a reference frequency signal Sr, which is a signal having a specific frequency. The reference frequency signal Sr is input to an input terminal 43 of the band pass filter 41 and to the phase comparator circuit 42.

The band pass filter 41 includes a resistor element and a variable capacitor element having characteristics such as a supply voltage fluctuation coefficient, a temperature coefficient, and a production variance degree which are equivalent to those of the resistor elements and the capacitor elements included in the variable attenuator 7b. A signal Sb which has passed the band pass filter 41 is input to the phase comparator circuit 42. The phase comparator circuit 42 compares the phase of the reference frequency signal Sr and the phase of the reference frequency signal Sb which has passed the band pass filter 41, and supplies the result to a control terminal 44 of the band pass filter 41 as an output signal Sc. The phase comparator circuit 42 also supplies the output signal Sc from a control terminal 45 to the capacitance value control section 36 as an adjusting signal for adjusting the output of the characteristic frequency adjusting section 37. Thus, the characteristic frequency adjusting section 37 adjusts the characteristic frequency of the variable attenuator 7b.

As described above, with the transmission circuit according to the second embodiment of the present invention, since the variable attenuator 7b includes the characteristic frequency adjusting section 37, the characteristic frequency of the band pass filter 41 is controlled by the output signal Sc of the phase comparator circuit 42, and the characteristic frequency of the capacitance value control section 36 is adjusted also by the output signal Sc of the phase comparator 42. Therefore, the characteristic frequency is associated with the reference frequency fr. As a result, the characteristic frequency of the variable attenuator 7b can be adjusted.

In this embodiment, the characteristic frequency adjusting section 37 includes the band pass filter 41. The characteristic frequency adjusting section 37 may include a low pass filter (LPF) or a high pass filter (HPF) instead of the band pass filter 41. In this embodiment, the variable attenuator 7b is an 8-bit variable attenuator. Depending on the use of the transmission circuit, the number of bits of the variable attenuator 7b may be appropriately changed. In this embodiment, R2R type resistance-type attenuators are used. Alternatively, for example, π type or T type resistance-type attenuators provide substantially the same effect by connecting the variable capacitor elements to the resistor elements in parallel and controlling the capacitance values thereof in accordance with the transmission power control signal. In this embodiment, the variable capacitor elements CS1 through CS8 and CP1 through CP8 are connected to the resistor elements in parallel. Alternatively, a part of the variable capacitor elements may be replaced with capacitor elements having a fixed capacitance value.

Third Embodiment

Figure 8:
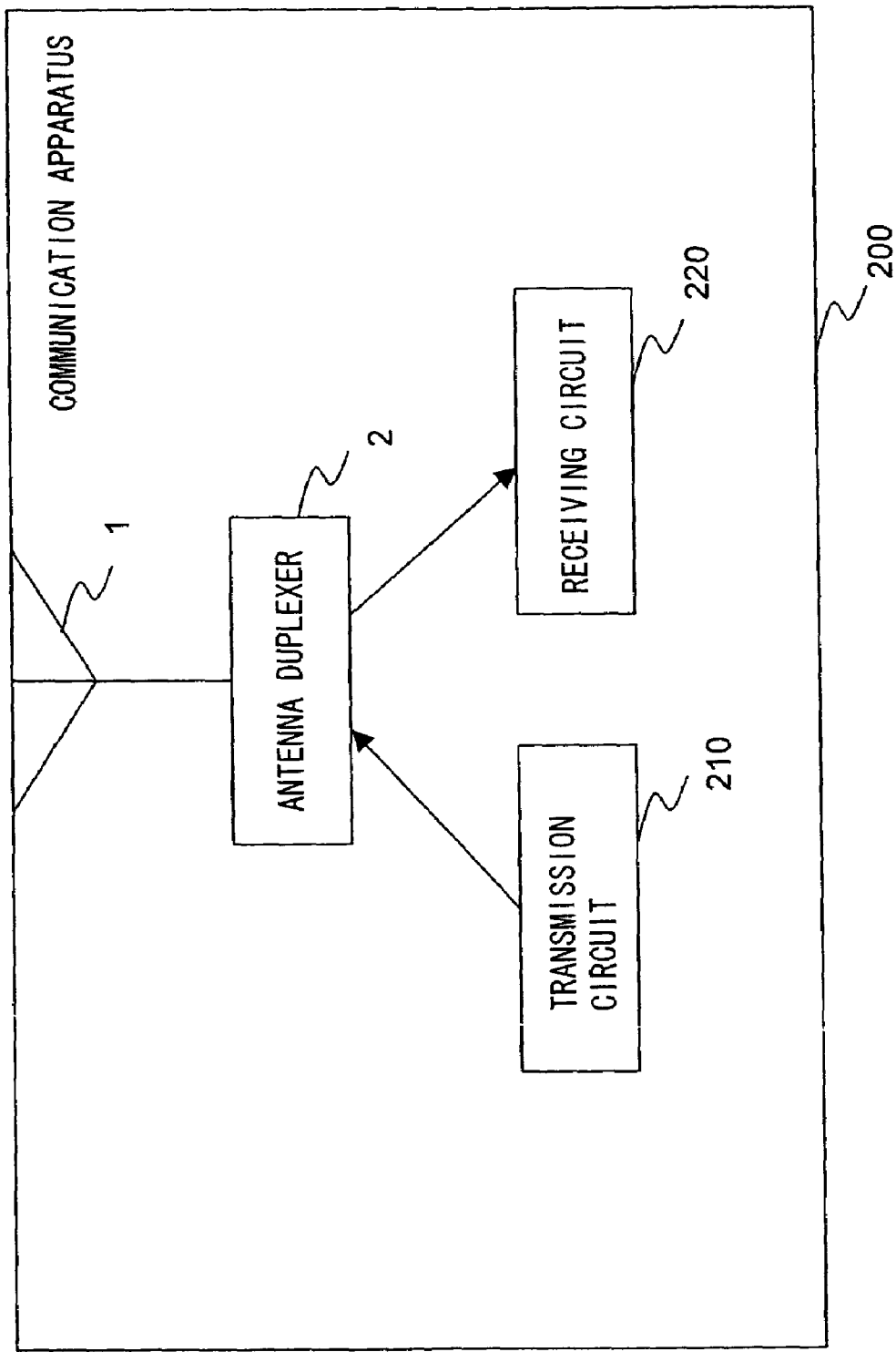
FIG. 8 is a block diagram showing an exemplary structure of a communication apparatus according to a third embodiment of the present invention.
Figure 9:
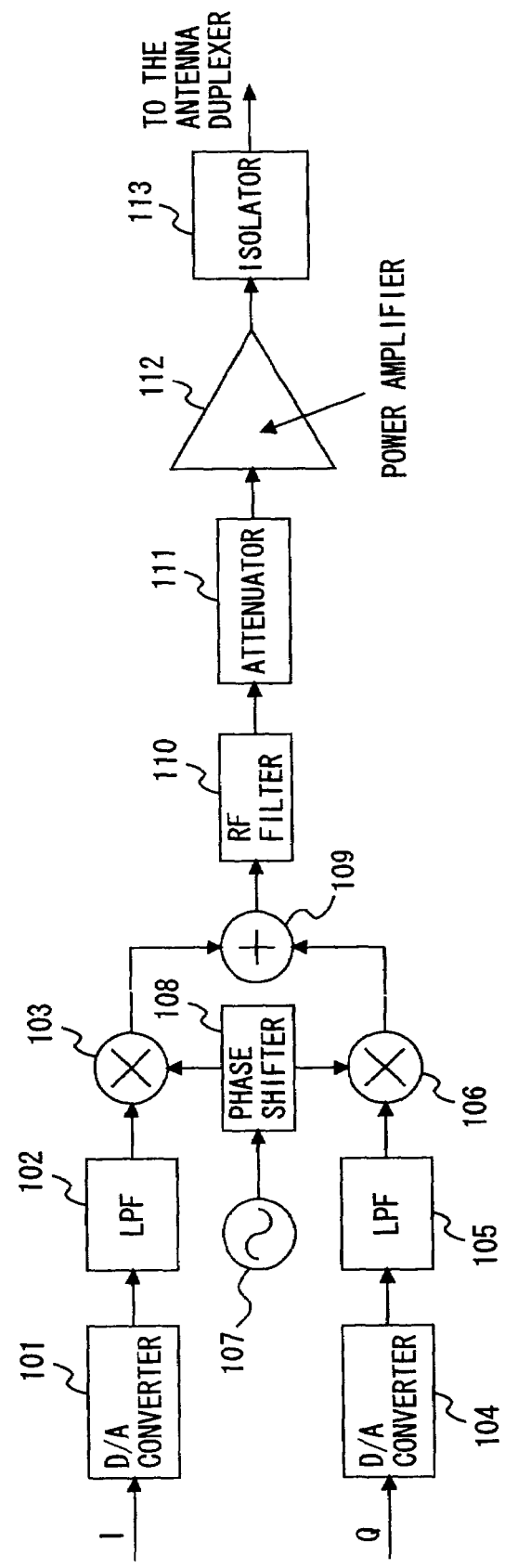
FIG. 9 is a block diagram showing an exemplary structure of a conventional transmission circuit by a quadrature modulation system.
Figure 10:
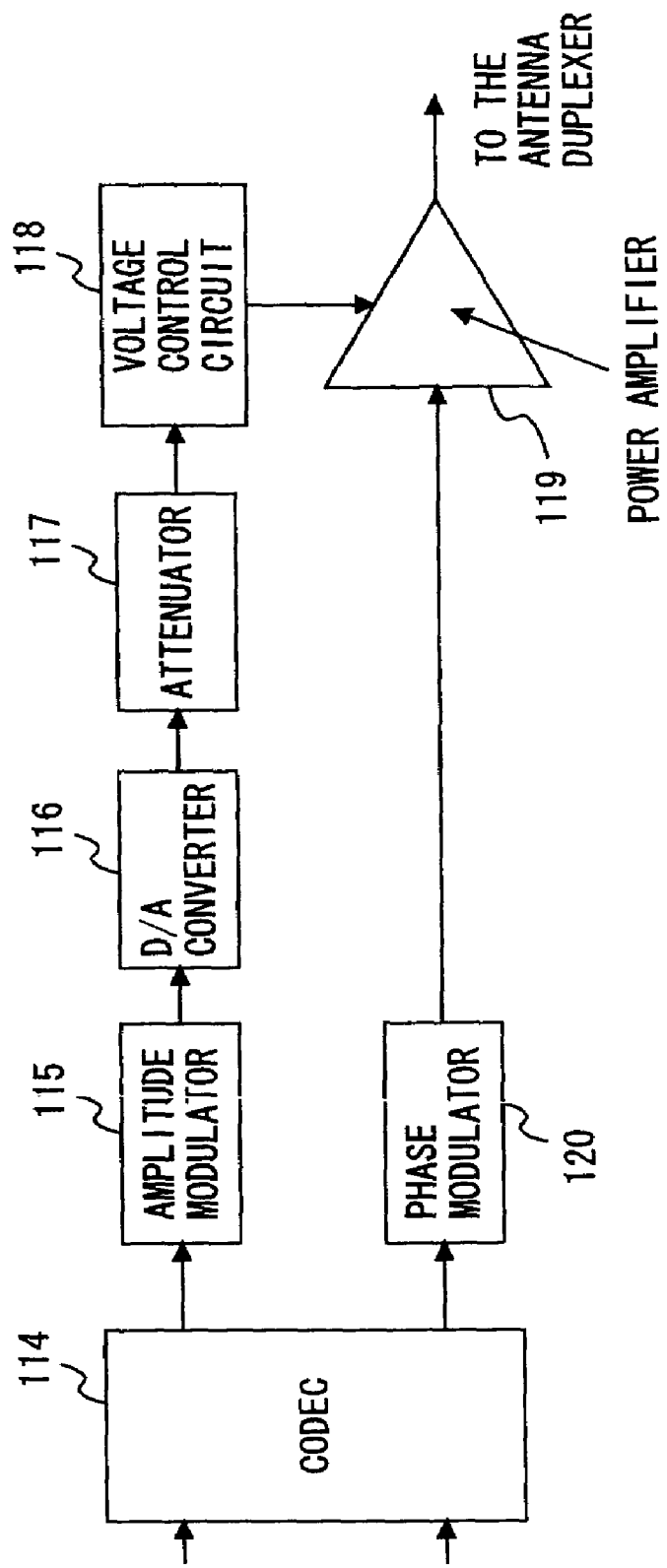
FIG. 10 is a block diagram showing an exemplary structure of a conventional transmission circuit by a polar modulation system.
Figure 11:
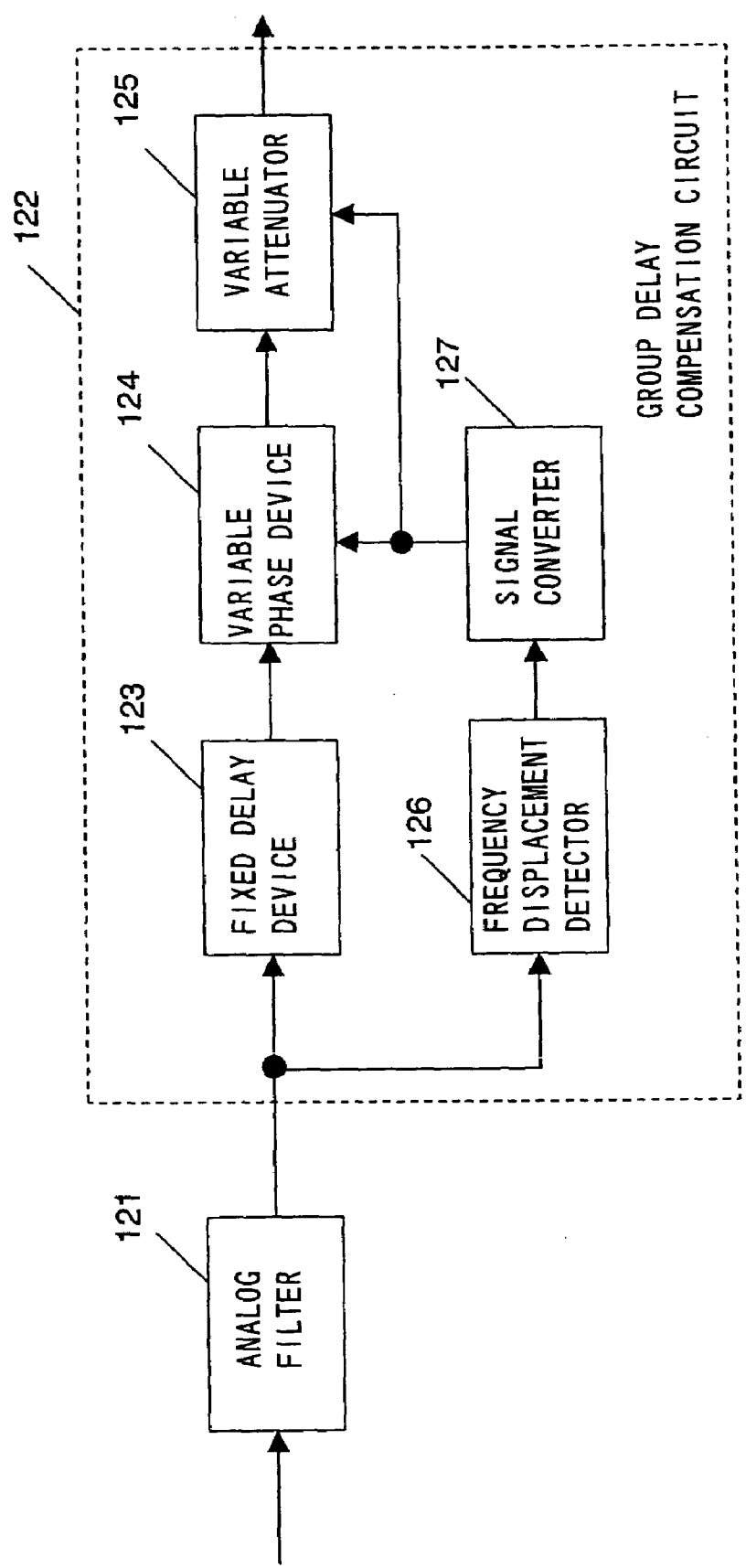
FIG. 11 is a block diagram showing an exemplary structure of a conventional group delay compensation circuit 122.

FIG. 8 is a block diagram showing an exemplary structure of a communication apparatus according to a third embodiment of the present invention. As shown in FIG. 8, the communication apparatus according to the third embodiment of the present invention includes a transmission circuit 210, a receiving circuit 220, an antenna duplexer 2, and an antenna 1. The transmission circuit 210 is a transmission circuit described in either the first embodiment or the second embodiment. The antenna duplexer 2 transfers a transmission signal which is output from the transmission circuit 210 to the antenna while preventing the transmission signal from leaking to the receiving circuit 220. The antenna duplexer 2 also transfers a receiving signal which is input from the antenna 1 to the receiving circuit 220 while preventing the receiving signal from leaking to the transmission circuit 210. Therefore, a transmission signal is output from the transmission circuit 210 and is released to the outside from the antenna 1 via the antenna duplexer 2. A receiving signal is received by the antenna 1 and received by the receiving circuit 220 via the antenna duplexer 2. The communication apparatus according to the third embodiment uses a transmission circuit according to the first or second embodiment and thus can acquire the linearity of the transmission signal with certainty and also realize low distortion as a wireless apparatus. In addition, since no branching element such as a directional coupler or the like is provided outside the transmission circuit 210, the loss from the transmission circuit 210 to the antenna 1 can be reduced. Therefore, the power consumption at the time of transmission can be reduced, which allows the communication apparatus to be used for a long period of time as a wireless communication apparatus.

A transmission apparatus according to the present invention is applicable to, for example, a communication apparatus such as a mobile phone or a wireless LAN device.

While the invention has been described in detail, the foregoing description is in all aspects illustrative and not restrictive. It is understood that numerous other modifications and variations can be devised without departing from the scope of the invention.

What is claimed is:

1. A transmission circuit for a polar modulation system, the transmission circuit comprising:
    a transmission power control section for generating a transmission power control signal for controlling transmission power of the transmission circuit;
    an attenuator for attenuating a magnitude of an amplitude signal by an attenuation amount in accordance with the transmission power control signal;
    a voltage control circuit for outputting a voltage controlled signal which is controlled in accordance with the amplitude signal output by the attenuator;
    a phase modulator for performing phase modulation on a phase signal and outputting a resultant signal as a phase modulated signal; and
    a power amplifier for amplifying the phase modulated signal in accordance with the voltage controlled signal which is output from the voltage control circuit to perform an amplitude modulation on the phase modulated signal, and outputting a resultant signal as a transmission signal;
    wherein the attenuator includes a plurality of resistor elements, a plurality of switching elements for switching connection between the plurality of resistor elements and an input terminal in accordance with a value of the transmission power control signal, a plurality of variable capacitor elements each of which is connected in parallel to one of the plurality of resistor elements a capacitance value control section for controlling capacitance values of the variable capacitor elements based on the transmission power control signal, and a characteristic frequency adjusting section for adjusting a characteristic frequency of the capacitance value control section,
    wherein the characteristic frequency adjusting section includes:
        a reference frequency signal generator for generating a reference frequency signal;
        a band pass filter for passing the reference frequency signal therethrough; and
        a phase comparator for comparing a phase of the reference frequency signal which has passed through the band pass filter and a phase of the reference frequency signal generated by the reference frequency signal generator, and
    wherein characteristic frequencies of the band pass filter and the capacitance value control section are adjusted in accordance with a result of the comparison performed by the phase comparator.

2. A transmission circuit according to claim 1, wherein when the amplitude signal is larger than a limit value in accordance with the transmission power control signal, the attenuator shapes a waveform of the amplitude signal such that the amplitude signal is equal to or smaller than the limit value.

3. A transmission circuit according to claim 1, wherein the attenuator switches the plurality of switching elements to ON or OFF in accordance with the value of the transmission power control signal so as to control an attenuation amount by which the amplitude signal is attenuated in a stepped manner.

4. A transmission circuit according to claim 1, wherein the band pass filter includes a resistor element and a variable capacitor element having a characteristic equivalent to that of the resistor elements and the variable capacitor elements included in the attenuator.

5. A communication apparatus comprising:
    a transmission circuit for generating a transmission signal; and
    an antenna for outputting the transmission signal generated by the transmission circuit;
    wherein the transmission circuit is a transmission circuit according to claim 1.

6. A communication apparatus according to claim 5, further comprising:
    a receiving circuit for processing a receiving signal received from the antenna; and
    an antenna duplexer for outputting the transmission signal generated by the transmission circuit to the antenna and outputting the receiving signal received from the antenna to the receiving circuit.

* * * * *